United States Patent
Shimoyama et al.

(10) Patent No.: US 7,218,120 B2
(45) Date of Patent: May 15, 2007

(54) FAULT DETECTION CIRCUIT FOR A DRIVER CIRCUIT

(75) Inventors: Mikihito Shimoyama, Kiryu (JP); Takayuki Kawakura, Kiryu (JP); Tomoyuki Ogawa, Kiryu (JP); Naohiko Shiga, Kiryu (JP); Yuichi Yanagita, Kiryu (JP); Katsuhiro Tanino, Saitama (JP)

(73) Assignee: Mitsuba Corporation, Gunma (JP)

( * ) Notice: Subject to any disclaimer, the term of this patent is extended or adjusted under 35 U.S.C. 154(b) by 0 days.

(21) Appl. No.: 11/094,329

(22) Filed: Mar. 30, 2005

(65) Prior Publication Data

US 2005/0218904 A1  Oct. 6, 2005

(30) Foreign Application Priority Data

Mar. 31, 2004 (JP) ............................. 2004-105329

(51) Int. Cl.
 *G01R 31/08* (2006.01)
 *H02P 1/04* (2006.01)

(52) U.S. Cl. ...................... 324/523; 318/430; 324/522

(58) Field of Classification Search ................ 324/523, 324/522; 318/430, 434

See application file for complete search history.

(56) References Cited

U.S. PATENT DOCUMENTS

| | | | | |
|---|---|---|---|---|
| 5,085,286 A | * | 2/1992 | Danzaki et al. | 180/179 |
| 5,602,735 A | * | 2/1997 | Wada | 701/41 |
| 6,094,021 A | * | 7/2000 | Noro et al. | 318/138 |
| 6,330,140 B1 | * | 12/2001 | Wilson-Jones et al. | 361/87 |
| 6,332,506 B1 | * | 12/2001 | Kifuku | 180/443 |
| 6,930,490 B2 | * | 8/2005 | Saunders et al. | 324/511 |
| 2004/0189318 A1 | * | 9/2004 | Kitagawa et al. | 324/523 |

FOREIGN PATENT DOCUMENTS

| JP | 07-213092 | 8/1995 |
|---|---|---|
| JP | 09-247848 | 9/1997 |

* cited by examiner

*Primary Examiner*—Andrew H. Hirshfeld
*Assistant Examiner*—Jeff Natalini
(74) *Attorney, Agent, or Firm*—Carrier, Blackman & Associates, P.C.; Joseph P. Carrier; William D. Blackman

(57) ABSTRACT

Various component parts of a driver circuit for drive sources such as electric motors and clutches, such as relays and FETs as well as the drive sources can be tested by selectively energizing the relays and evaluating the voltage levels of the selected points by using the first and second test voltage detection circuits. This testing process is typically executed before the power up of the drive circuit. The test current is so small that the drive sources would not be inadvertently activated and various components would not be damaged even when there is any faulty component in the driver circuit. When any faulty component is detected in the testing process, the driver circuit may be prevented from being powered up so that any undesired operation of the drive sources or permanent damage to various components owing to such a faulty component may be avoided.

16 Claims, 2 Drawing Sheets

Fig.2

| mode | state | | | | | | | | faults that can be identified | | | | | | | |
|---|---|---|---|---|---|---|---|---|---|---|---|---|---|---|---|---|
| | Q1 | RY1 | RY2 | RY3 | RY4 | 1st test point | 2nd test point | result | RY1 | RY2 | RY3 | RY4 | FET1 | motor 3 terminal | FET2 | clutch 4 terminal |
| M1 | × | × | × | × | × | L | L | good | - | - | - | - | good | good | good | good |
| M1 | × | × | × | × | × | H | - | bad | - | - | - | - | - | short-circuit to battery | - | - |
| M1 | × | × | × | × | × | - | H | bad | - | - | - | - | - | - | - | short-circuit to battery |
| M2 | O | × | × | × | × | H | H | good | - | - | - | - | good | good | good | good |
| M2 | O | × | × | × | × | L | - | bad | - | - | - | - | short-circuit fault | - | - | - |
| M2 | O | × | × | × | × | L | - | bad | - | - | - | - | - | short-circuit to ground | - | - |
| M2 | O | × | × | × | × | - | L | bad | - | - | - | - | - | - | short-circuit fault | - |
| M2 | O | × | × | × | × | - | L | bad | - | - | - | - | - | - | - | short-circuit to ground |
| M3 | × | O | - | × | × | L | - | good | - | - | good | good | - | - | - | - |
| M3 | × | O | - | × | × | H | - | bad | - | - | on fault | - | - | - | - | - |
| M3 | × | O | - | O | × | H | - | bad | - | - | - | on fault | - | - | - | - |
| M3 | × | O | - | O | × | L | - | good | - | - | good | good | - | - | - | - |
| M3 | × | O | - | × | O | L | - | bad | - | - | open fault | - | - | - | - | - |
| M3 | × | O | - | × | O | H | - | good | - | - | good | good | - | - | - | - |
| M3 | × | O | - | O | O | L | - | bad | - | - | - | open fault | - | - | - | - |
| M4 | × | - | × | - | - | - | L | good | - | good | - | - | - | - | - | - |
| M4 | × | - | × | - | - | - | H | bad | - | on fault | - | - | - | - | - | - |
| M4 | × | × | - | O | × | L | - | good | good | - | - | - | - | - | - | - |
| M4 | × | × | - | O | × | H | - | bad | on fault | - | - | - | - | - | - | - |

FAULT DETECTION CIRCUIT FOR A DRIVER CIRCUIT

TECHNICAL FIELD

The present invention relates to a fault detection circuit for detecting a normal/abnormal state of a driver circuit for driving a drive source such as electric motors, clutches and solenoids.

BACKGROUND OF THE INVENTION

Conventionally, in a reversible driver circuit for driving an electric motor, a bridge circuit including a relay in each arm of the bridge circuit was typically used. It was customary to connect a shunt resistor in the ground end of the electric motor for detecting the motor current, and monitor the state of the driver circuit by comparing the detected motor current with the pulse signal that controls the operation of the motor. Such an arrangement is disclosed, for instance, in Japanese patent laid open publication No. 07-213092 (in particular, pages 3–4 and FIG. 2).

It is also known to connect an FET between a power source and a switch for reversing the polarity of the current supplied to the motor, and to prevent the application of an excessive voltage to the motor by turning off the FET by using a breakdown of a zener diode. Such an arrangement is disclosed in Japanese patent laid-open publication No. 9-247848 (in particular, page 6 and FIG. 1).

However, according to such monitoring and detecting circuits, a failure of the circuit can be detected only after the electric current is supplied to the motor. Therefore, when the electric motor is applied to an automotive closure such as a power slide door, power window or sunroof, the user may discover that the motor cannot be controlled after turning on the electric motor, and the motor may behave in an unpredicted manner. Also, the failure in the motor driver circuit may be discovered only after the vehicle has started running. It is possible to install a fail-safe circuit to totally disable the motor when a failure of the driver circuit is detected, but it requires additional circuit elements and undesirably increases the complexity of the driver circuit.

Even when an abnormal motor current is detected, it was not possible to determine if the failure is in the electric motor or in the driver circuit. Therefore, the countermeasure that may be taken may not be proper if the cause of the failure cannot be determined. For instance, when there is any short-circuiting in the driver circuit, excessive motor current may be supplied to the motor, thereby damaging the electric motor or other circuit elements. When the failure is caused by a circuit element, the motor cannot be controlled as desired.

BRIEF SUMMARY OF THE INVENTION

In view of such problems of the prior art, a primary object of the present invention is to provide a fault detection circuit that allows a cause of a failure to be identified in a driver circuit for drive sources such as electric motors, clutches, solenoids and so forth.

A second object of the present invention is to provide a fault detection circuit that prevents supply of electric current to a drive source when a fault is detected, and thereby protects the drive source from an application of an excessive voltage.

A third object of the present invention is to provide a fault detection circuit that is able to detect a fault in a driver circuit before powering up the driver circuit.

According to the present invention, at least some of these objects and other objects can be accomplished by providing a fault detection circuit for a driver circuit for a drive source, the driver circuit including a drive source and a first switching device that are connected in a series between a power source and ground, comprising: a test voltage supply circuit adapted to feed a test voltage to a node between the drive source and first switching device; a test voltage detection circuit adapted to detect a voltage of the node; and a controller adapted to evaluate the voltage at the node before a power-up of the drive circuit. Typically, the controller is further adapted to evaluate the voltage at the node when the test voltage is applied and when the test voltage is not applied, and the test voltage supply circuit includes a current limiting element, for instance in the form of a resistor.

Thus, according to the present invention, by applying a test voltage of a limited current capacity to a suitable test point of the driver circuit before the power up of the drive circuit, any fault in the drive source or other components of the driver circuit can be detected before the power up of the driver circuit so that a suitable countermeasure may be taken. The test current is so small that the drive sources would not be inadvertently activated and various components would not be damaged even when there is any faulty component in the driver circuit. When any faulty component is detected in the testing process, the driver circuit may be prevented from being powered up or a warning is made so that any undesired operation of the drive sources or permanent damage to various components owing to such a faulty component may be avoided.

A driver circuit for a reversible motor typically comprises a pair of second switching devices that are connected on either end of the drive source in a serial connection between the power source and ground to allow the drive source to receive a drive voltage of either polarity. In such a case, the controller may be adapted to selectively and individually turn on the second switching devices during a testing process so that a fault in the second switching devices may also be tested during the testing process. According to a preferred embodiment of the present invention, the driver circuit may further comprise a third switching device that is included in the serial connection between the power source and ground, and the controller is adapted to selectively turn on the third switching device during the testing process. Typically, the first switching device comprises an FET, the second switching devices comprise electromagnetic relays, and the third switching device comprises an electromagnetic relay.

In an automotive power slide door or other automotive applications, the driver circuit may be adapted to drive both an electric motor and an electromagnetic clutch. The present invention may be advantageously applied to such applications by providing a fault detection circuit for a driver circuit for an electric motor and an electromagnetic clutch, the driver circuit including a pair of serial connections between a power source and ground, the first serial connection including an electric motor, a first switching device and a pair of second switching devices connected on either end of the electric motor to allow the electric motor to receive a drive voltage of either polarity, the second serial connection including an electromagnetic clutch and a first switching device; the fault detection circuit, comprising: a test voltage supply circuit adapted to feed a test voltage to a test voltage node between the electric motor and first switching device in the first serial connection and another test voltage node between the electromagnetic clutch and first switching device in the second serial connection, the test voltage supply circuit including a current limiting element; a first test voltage detection circuit adapted to detect a voltage of the test voltage node of the first serial connection; a second test voltage detection circuit adapted to detect a voltage of the test voltage node of the second serial connection; and a controller adapted to evaluate the voltage at the test voltage nodes of the first and second serial connections before a power-up of the drive circuit.

BRIEF DESCRIPTION OF THE DRAWINGS

Now the present invention is described in the following with reference to the appended drawings, in which:

FIG. 2 is a table showing the various modes of the testing process according to the present invention.

DETAILED DESCRIPTION OF THE PREFERRED EMBODIMENTS

Figure 1:
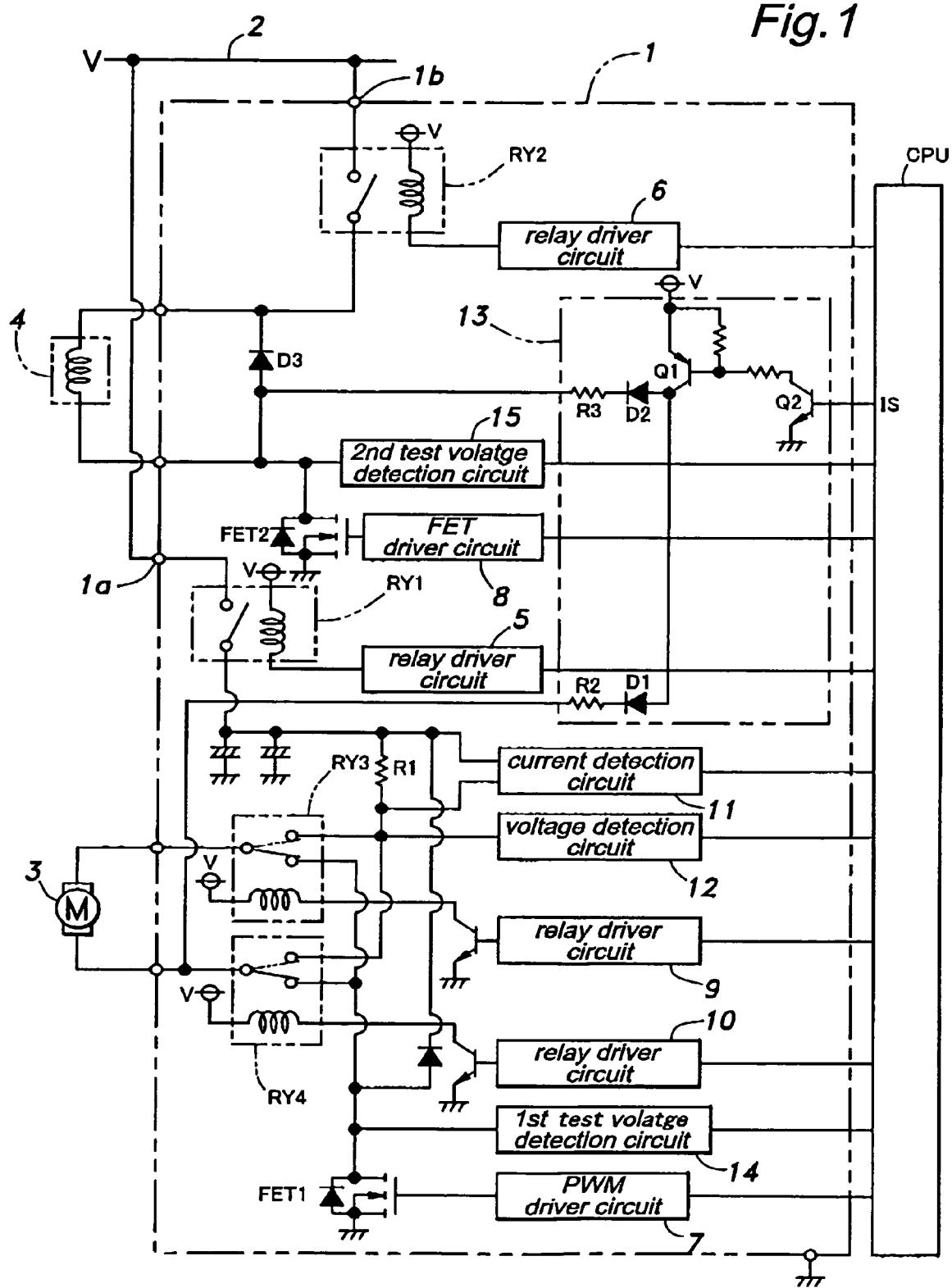
FIG. 1 is a circuit diagram of a fault detection circuit for a driver circuit embodying the present invention.

FIG. 1 shows a simplified circuit diagram of a driver circuit embodying the present invention. This driver circuit can be used, for instance, in controlling an automotive closure system such as a power slide door, a power window, a sunroof or the like. As shown in the drawing, power terminals 1a and 1b of the driver circuit 1 are connected to a positive power line 2 of a battery (V=12 volts, for instance) not shown in the drawing. The output end of the driver circuit 1 is connected to drive sources such as an electric motor 3 and a magnetic clutch 4 that are used for controlling the movement of an automotive slide door not shown in the drawings. The clutch 4 is engaged when the slide door is to be actuated by the electric motor 3. When the clutch 4 is disengaged, the slide door may be moved freely by hand. The clutch 4 is provided with a solenoid not shown in the drawings that engages the clutch when energized and disengages the clutch when de-energized.

One of the power terminals 1a is connected to a normally open contact of a first relay RY1 that controls the supply of power to a motor driver circuit, and the other power terminal 1b is connected to a normally open contact of a second relay RY2 that controls the supply of power to a clutch driver circuit.

The solenoid of the first relay RY1 is controlled by a first relay driver circuit 5 that energizes and de-energizes the first relay RY1 so as to selectively activate the motor 3 according to a door close/open signal supplied from a controller CPU essentially consisting of a MPU operating under the control a program stored in internal ROM. The solenoid of the second relay RY2 is controlled by a second relay driver circuit 6 that energizes and de-energizes the second relay RY2 so as to engage/disengage the clutch 4 according to a door close/open signal supplied from the controller CPU.

The common contact of the first relay RY1 is connected to the normally open contacts of a third relay RY3 and a fourth relay RY4 via a shunt resistor R1 which is described hereinafter. The normally closed contacts of the third and fourth relays RY3 and RY4 are grounded via a first FET (FET1). Each relay RY3 or RY4 can take one of two positions depending on the energized state of the corresponding solenoid so that each motor terminal is connected to one of the power source and ground as desired.

The first FET (FET1) is PWM (pulse width modulation) controlled by a PWM driver circuit 7 which is in turn controlled by the controller CPU. The PWM control of the motor 3 is useful, for instance, when controlling the speed of a power slide door at a constant level without respect to the inclination of the vehicle. The first FET (FET1) may also be provided on the power source end of the motor 3 instead of on the ground end of the motor 3.

The other terminal of the clutch 4 is grounded via a second FET (FET2) which is also controlled by an FET driver circuit 8 which is in turn controlled by to a clutch control signal supplied from the controller CPU. For instance, when the vehicle is parked on an inclined road surface and the slide door may be closed solely by the gravitational force acting on the door, the required closing movement of the door may be effected simply by engaging and disengaging the clutch 4 as required without activating the electric motor 3. This saves the energy consumption. Such a control is made possible by connecting the second FET (FET2) to the clutch 4. It is also possible to use other switching devices instead of the first and second FETs (FET1, FET2) as can be appreciated by a person skilled in the art.

One of the terminals of the motor 3 is connected to the common contact of the third relay RY3, and the other terminal of the motor 3 is connected to the common contact of the fourth replay RY4. The solenoid of the third relay RY3 is controlled by a third relay driver circuit 9, and the solenoid of the fourth relay RY4 is controlled by a fourth relay driver circuit 10. When the motor 3 is to be turned in the normal direction according to an open/close signal from the controller CPU, the third relay driver circuit 9 supplies an energization current to the solenoid of the third relay RY3 so that only the common contact of the third relay RY3 is connected to the corresponding normally open contact while the common contact of the fourth relay RY4 is kept in contact with the normally closed contact. When the motor 3 is to be turned in the reverse direction according to an open/close signal from the controller CPU, the fourth relay driver circuit 10 supplies an energization current to the solenoid of the fourth relay RY4 so that only the common contact of the fourth relay RY4 is connected to the corresponding normally open contact while the common contact of the third relay RY3 is kept in contact with the normally closed contact. In FIG. 1, the engagement between the common contact with the normally closed contact is indicated by a solid line (open state) while the engagement between the common contact with the normally open contact is indicated by a chain-dot line (closed state) in each of the third and fourth relays RY3 and RY4.

A current detection circuit 11 is connected across the shunt resistor R1 to detect the current that flows through the resistor R1. A voltage detection circuit 12 is connected to the node to which the normally open contacts of the third and fourth relays RY3 and RY4 and ground side end of the resistor R1 are connected. The current detection circuit 11 and voltage detection circuit 12 are primarily used for the normal control action for the electric motor 3, and are not directly related to the fault detection circuit of the present invention.

The fault detection circuit further comprises a test current supply circuit 13 that derives electric power from a line branched off from the power line 2. The test current supply circuit 13 comprises a first transistor Q1 having an emitter connected to the branched power line, a second transistor Q2 having a collector connected to the base of the first transistor Q1 for turning on and off the first transistor Q1 according to a control signal fed from IS terminal of the controller CPU, a current limit resistor R2 connected to the collector of the first transistor Q1 via a diode D1, and another current limit resistor R3 similarly connected to the first transistor Q1 via a diode D2.

The other end of the current limit resistor R2 is connected to a node connected to both the common contact of the fourth relay RY4 and one of the motor terminals, and the other end of the other current limit resistor R3 is connected to a node connected to both the drain of the second FET (FET2) and one of the clutch terminals. A diode D3 is connected between a first node connected to both this clutch terminal and the drain of the second FET (FET2) and a second node connected to both the other clutch terminal in such a manner that electric current may be permitted to flow only from the first node to the second node.

A first test voltage detection circuit 14 is connected to a node that is connected to the normally closed contacts of the third and fourth relays RY3 and RY4 and the drain of the first FET (FET1), and a second test voltage detection circuit 15 is connected to a node that is connected to one of the clutch terminals and the drain of the second FET (FET2). These test voltage detection circuits 14 and 15 are each adapted to detect a voltage of the corresponding node, but may also be substituted by other voltage or current detection circuits.

The mode of operation of this detection circuit is now described with reference to the table given in FIG. 2. In the table of FIG. 2, the conductive state of the transistor Q1 is indicated by "O", and the test current supply circuit 13 feeds electric current in this state. Conversely, the shut off state of the transistor Q1 is indicated by "X", and the test current supply circuit 13 does not feed electric current in this state. Also, with respect to each of the relays RY1 to RY4, the closed state according to a control signal from the control CPU is indicated by "X", and the open state according to a control signal from the control CPU is indicated by "O".

When each of the test voltage detection circuits 14 and 15 has detected a voltage, the corresponding state is indicated by "H". When no voltage is detected, the corresponding state is indicated by "L". "Normal" in the table means that no fault is detected as far as the kinds of fault which the particular mode covers are concerned. Any item that cannot be determined by the particular mode is indicated by "-".

According to the present invention, the detection circuit may be adapted to execute a series of fault detecting actions before the drive currents are supplied to the motor 3 and clutch 4 under normal control action, for instance when starting up the system. The supply of test current to various parts, evaluation of the detection result of each fault detection circuit 14 or 15, and identification of a fault in any particular component may be executed by the controller CPU according to a prescribed program.

Firstly is described mode M1 for detecting a short-circuit fault in the power source end of the drive sources such as the motor 3 and clutch 4. In this mode, the first and second test voltage detection circuits 14 and 15 detect the corresponding voltage levels while no test current is fed from the test current supply circuit 13 (no test current command is produced from IS terminal of the controller CPU) and none of the relays RY1 to RY4 are energized. As the first and second test voltage detection circuits 14 and 15 are required to detect the corresponding voltages levels in any test modes, their actions are omitted from the description of the remaining test modes.

When the first test voltage detection circuit 14 does not detect the voltage (L) under this condition, it can be concluded that neither the first FET (FET1) nor the motor 3 has any short-circuiting to the power source (the $1^{st}$ line of the table). Similarly, when the second test voltage detection circuit 15 does not detect the voltage (L), it can be concluded that neither the second FET (FET2) not the clutch 4 has any short-circuiting to the power source (the $1^{st}$ line of the table).

On the other hand, if the first test voltage detection circuit 14 detects the voltage (H), it can be concluded that the motor 3 may have a short-circuiting to the power source (the 2nd line of the table). Similarly, when the second test voltage detection circuit 15 detects the voltage (H), it can be concluded that the clutch 4 may have a short-circuiting to the power source (the 3rd line of the table).

Secondly is described mode M2 for detecting a short-circuiting to the ground end of the drive sources such as the motor 3 and clutch 4. In this mode, the first and second test voltage detection circuits 14 and 15 detect the corresponding voltage levels while the test current is fed from the test current supply circuit 13 (the test current command is produced from IS terminal of the controller CPU) and none of the relays RY1 to RY4 are energized.

When the test current feed command is supplied to the second transistor Q2 from the controller CPU, the first transistor Q1 turns on, and this causes the test current to be fed from the test current supply circuit 13. The output end or collector of the first transistor Q1 is branched out into a pair of arms each including the corresponding current limiting resistor R2 or R3 so that only a limited amount of current is fed from the test current supply circuit 13. The magnitude of the test current is such that the motor 3 or clutch 4 would not be activated, and no damage would be caused to any of the circuit components even when the test current is directly grounded.

If the first test voltage detection circuit 14 is "H" with the transistor Q1 turned on and the relays RY1, RY3, RY4 de-energized, as it means that the test current fed to the motor terminal has reached the first test voltage detection circuit 14 without being diverted to anywhere or there is nothing that pulls down the voltage at the input end of the first test voltage detection circuit 14, there is no short-circuiting of the motor terminal or the first FET (FET1) to the ground (the 4th line of the table). Similarly, if the second test voltage detection circuit 15 is "H", as it means that the test current fed to the clutch terminal has reached the second test voltage detection circuit 15 without being diverted to anywhere or there is nothing that pulls down the voltage at the input end of the second test voltage detection circuit 15, there is no short-circuiting of the clutch terminal or the second FET (FET2) to the ground (the 4th line of the table).

Test mode M2 is intended to detect the short-circuiting to the ground. However, if there is any short-circuiting to the power source side, an unusually high voltage from the power source may be detected. Therefore, if the first and second test voltage detection circuits 14 and 15 are constructed in such manner as to be able to detect different voltage levels, it may be possible to distinguish if the detected fault is caused by a short-circuiting to the ground or a short-circuiting to the power source. In the illustrated embodiment, a short-circuiting to the power source is first detected by executing test mode M1, and a short-circuiting to the ground is then detected by executing test mode M2.

In test mode M2, if the first test voltage detection circuit 14 is "L", it can be concluded that there is a short-circuiting to the ground of the first FET (FET1) (the 5th line of the table) or a short-circuiting to the ground of the motor 3 (the 6th line of the table). Similarly, if the second test voltage detection circuit 15 is "L", it can be concluded that there is a short-circuiting to the ground of the second FET (FET2) (the 7th line of the table) or a short-circuiting to the ground of the clutch 4 (the 8 the line of the table).

By executing test modes M1 and M2, it is possible to detect the short-circuiting to the power source end and ground end of the drive source (such as the motor 3 and clutch 4) and the short-circuiting to the power source end of the first and second FETs (FET1, FET2).

Thirdly is described test mode M3 for a fault detection of a circuit that includes a switch for reversibly driving the drive source (electric motor 3). In the illustrated embodiment, the switch for reversibly driving the drive source includes the third and fourth relays RY3 and RY4, and it is desired to detect the short-circuiting fault and open fault of each of the relays RY3 and RY4.

In test mode M3, no test current is fed from the test current supply circuit 13 (no test current supply command from terminal 15 of the controller CPU), and the first relay RY1 is energized. These conditions are assumed in the following description of test mode M3. The third and fourth relays RY3 and RY4 are selectively and individually energized (as indicated by "O" in the table) and de-energized (as indicated by "X" in the table).

When both the third and fourth relays RY3 and RY4 are de-energized, and the first test voltage detection circuit 14 is "L", as it means that the third and fourth relays RY3 and RY4 are shutting off the power source, there is no on-fault in each of the third and fourth relays RY3 and RY4 (the ninth line of the table). When both the third and fourth relays RY3 and RY4 are de-energized, and the first test voltage detection circuit 14 is "H", there may be an on-fault in at least one of the third and fourth relays RY3 and RY4 (the tenth and eleventh line of the table).

Then, the third relay RY3 is energized while the fourth relay RY4 is de-energized. If the first test voltage detection circuit 14 is "H", as it means a voltage is applied to the first test voltage detection circuit 14 via the third relay RY3 (which is on), motor 3 and fourth relay RY4 (which is off), it can be concluded that the third and fourth relays RY3 and RY4 may be operating normally (the 12th line of the table). If the first test voltage detection circuit 14 is "L" under the same condition, as it means that the third relay RY3 has failed to switch over to the side of the power source, it can be concluded that the third relay RY3 may have an open-fault (the 13th line of the table).

Then, the third relay RY3 is de-energized while the fourth relay RY4 is energized. If the first test voltage detection circuit 14 is "H", as it means a voltage is applied to the first test voltage detection circuit 14 via the third relay RY3 (which is off), motor 3 and fourth relay RY4 (which is on), it can be concluded that the third and fourth relays RY3 and RY4 may be operating normally (the 14th line of the table). If the first test voltage detection circuit 14 is "L" under the same condition, as it means that the fourth relay RY4 has failed to switch over to the side of the power source, it can be concluded that the fourth relay RY4 may have an open-fault (the 15th line of the table).

In test mode M4, no test current is fed from the test current supply circuit 13 (no test current supply command from terminal IS of the controller CPU), and an on-fault of each of the first and second relays RY1 and RY2 can be detected.

An on-fault of the second relay RY2 can be detected by de-energizing the second relay RY2. At this time, if the second test voltage detection circuit 15 is "L", as it means that the second relay RY2 is shutting off the power source, it can be concluded that the second relay RY2 is operating normally (the 16th line of the table). On the other hand, if the second test voltage detection circuit 15 is "H", as it means that the second relay RY2 provides a conductive path so that the power source voltage is applied to the second test voltage detection circuit 15 via the clutch 4, it can be concluded that the second relay RY2 may be faulty (the 17th line of the table).

An on-fault of the first relay RY1 can be detected by de-energizing the first relay RY1 and, at the same time, for instance, the third relay RY3 is energized for the purpose of providing a conductive path from the first relay RY1 to the first test voltage detection circuit 14 while the fourth relay RY4 is de-energized. At this time, if the first test voltage detection circuit 14 is "L", as it means that the first relay RY1 is shutting off the power source, it can be concluded that the first relay RY1 is operating normally (the 18th line of the table). On the other hand, if the first test voltage detection circuit 14 is "H", as it means that the first relay RY1 provides a conductive path so that the power source voltage is applied to the first test voltage detection circuit 14 via the third relay RY3, motor 3 and fourth relay RY4, it can be concluded that the first relay RY1 may be faulty (the 19th line of the table).

Thus, according to the foregoing embodiment, various component parts of the driver circuit such as relays RY1 to RY4 and FETs (FET1, FET2) as well as the drive sources such as the motor 3 and clutch 4 can be tested by selectively energizing the relays and evaluating the voltage levels of the selected points by using the first and second test voltage detection circuits 14, 15. This testing process is typically executed before the power up of the drive circuit. The test current is so small that the drive sources would not be inadvertently activated and various components would not be damaged even when there is any faulty component in the driver circuit. When any faulty component is detected in the testing process, the driver circuit may be prevented from being powered up or a warning is made so that any undesired operation of the drive sources or permanent damage to various components owing to such a faulty component may be avoided.

Although the present invention has been described in terms of preferred embodiments thereof, it is obvious to a person skilled in the art that various alterations and modifications are possible without departing from the scope of the present invention which is set forth in the appended claims.

The invention claimed is:

1. A fault detection circuit for a driver circuit for a drive source, the driver circuit including an electric motor and a FET that are connected in series between a power source and ground and the FET being configured to be selectively turned on and off for controlling the electric motor when the electric motor is in operation, said fault detection circuit comprising:
   a test voltage supply circuit adapted to feed a test voltage to a node between the electric motor and the FET, the test voltage supply circuit being different from a power source circuit;
   a test voltage detection circuit adapted to detect a voltage of the node; and
   a controller adapted to evaluate the voltage at the node before a power-up of the drive circuit when the test voltage is applied and when the test voltage is not applied.

2. A fault detection circuit according to claim 1, wherein the driver circuit further comprises a pair of second switching devices that are connected on either end of the drive source in a serial connection between the power source and ground to allow the drive source to receive a drive voltage of either polarity, and the controller is adapted to selectively and individually turn on the second switching devices during a testing process.

3. A fault detection circuit according to claim 2, wherein the second switching devices comprise electromagnetic relays.

4. A fault detection circuit according to claim 2, wherein the driver circuit further comprises a third switching device that is included in the serial connection between the power source and ground, and the controller is adapted to selectively turn on the third switching device during the testing process.

5. A fault detection circuit according to claim 4, wherein the third switching device comprises an electromagnetic relay.

6. A fault detection circuit according to claim 1, wherein the test voltage supply circuit includes a current limiting element.

7. A fault detection circuit according to claim 1, wherein a voltage of the test voltage supply circuit is less than a voltage of the power source circuit.

8. A fault detection circuit for a driver circuit for an electric motor and an electromagnetic clutch, the driver circuit including first and second serial connections between a power source and ground, the first serial connection including an electric motor, a first switching device and a pair of second switching devices connected on either end of the electric motor to allow the electric motor to receive a drive voltage of either polarity, the second serial connection including an electromagnetic clutch and a first switching device;

the fault detection circuit, comprising:
 a test voltage supply circuit adapted to feed a test voltage to a test voltage node between the electric motor and the first switching device in the first serial connection and another test voltage node between the electromagnetic clutch and the first switching device in the second serial connection, the test voltage supply circuit including a current limiting element;
 a first test voltage detection circuit adapted to detect a voltage of the test voltage node of the first serial connection;
 a second test voltage detection circuit adapted to detect a voltage of the test voltage node of the second serial connection; and
 a controller adapted to evaluate the voltage at the test voltage nodes of the first and second serial connections before a power-up of the drive circuit;
 wherein the test voltage supply circuit is different from the power source circuit.

9. A fault detection circuit according to claim 8, wherein the controller is further adapted to evaluate the voltage at the nodes when the test voltage is applied and when the test voltage is not applied.

10. A fault detection circuit according to claim 8, wherein each said first switching device comprises an FET, and each said second switching device comprises an electromagnetic relay.

11. A fault detection circuit according to claim 8, wherein the first serial connection further comprises a third switching device, and the controller is adapted to selectively turn on the third switching device during a testing process.

12. A fault detection circuit according to claim 11, wherein each said first switching device comprises an FET, and each said second switching device comprises an electromagnetic relay, and the third switching device comprises an electromagnetic relay.

13. A fault detection circuit according to claim 8, wherein a voltage of the test voltage supply circuit is less than a voltage of the power source circuit.

14. A fault detection circuit for a driver circuit for a drive source, the driver circuit including an electromagnetic clutch and a FET that are connected in series between a power source and ground and the FET being configured to be selectively turned on and off for controlling the electromagnetic clutch when the electromagnetic clutch is in operation, said fault detection circuit comprising:
 a test voltage supply circuit adapted to feed a test voltage to a node between the electromagnetic clutch and the FET, the test voltage supply circuit being different from a power source circuit;
 a test voltage detection circuit adapted to detect a voltage of the node; and
 a controller adapted to evaluate the voltage at the node before a power-up of the drive circuit when the test voltage is applied and when the test voltage is not applied.

15. A fault detection circuit according to claim 14, wherein the test voltage supply circuit includes a current limiting element.

16. A fault detection circuit according to claim 14, wherein a voltage of the test voltage supply circuit is less than a voltage of the power source circuit.

* * * * *

UNITED STATES PATENT AND TRADEMARK OFFICE
CERTIFICATE OF CORRECTION

PATENT NO.       : 7,218,120 B2
APPLICATION NO.  : 11/094329
DATED            : May 15, 2007
INVENTOR(S)      : Shimoyama et al.

It is certified that error appears in the above-identified patent and that said Letters Patent is hereby corrected as shown below:

In the drawings:
    Fig. 2, after "mode" and under "state", change "1st tast" to --1st test--.
Column 1:
    Line 20, change "laid open publication" to --laid-open publication--.
    Line 28, change "9-247848" to --09-247848--.
Column 3:
    Line 49, change "under the control" to --under the control of--.
Column 4:
    Line 7, change "by to a clutch" to --by a clutch--.
    Line 24, change "the fourth replay" to --the fourth relay--.
Column 5:
    Line 60, change "voltages levels" to --voltage levels--.
Column 6:
    Line 2, change "not the clutch" to --nor the clutch--.
    Line 35, change "anywhere or" to --anywhere, or--.
    Line 43, change "anywhere or" to --anywhere, or--.
    Line 67, change "the 8 the line" to --the 8th line--.
Column 7:
    Line 15, change "terminal 15" to --terminal IS--.
    Line 30, change "line of the table" to --lines of the table--.
Column 8:
    Line 47, change "electric motor and a" to --electric motor and an--.
Column 10:
    Line 25, change "and a FET" to --and an FET--.

Signed and Sealed this

Fourth Day of September, 2007

JON W. DUDAS
*Director of the United States Patent and Trademark Office*